United States Patent
Murakami et al.

(10) Patent No.: US 12,155,318 B2
(45) Date of Patent: Nov. 26, 2024

(54) POWER CONVERTER

(71) Applicant: DENSO CORPORATION, Kariya (JP)

(72) Inventors: Tatsuya Murakami, Kariya (JP);
Yuuta Hashimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 260 days.

(21) Appl. No.: 17/878,718

(22) Filed: Aug. 1, 2022

(65) Prior Publication Data
US 2022/0368242 A1    Nov. 17, 2022

Related U.S. Application Data

(63) Continuation of application No. PCT/JP2020/046764, filed on Dec. 15, 2020.

(30) Foreign Application Priority Data

Feb. 3, 2020 (JP) ................. 2020-016455

(51) Int. Cl.
| H05K 7/20 | (2006.01) |
| H02M 7/00 | (2006.01) |
| H02M 7/5387 | (2007.01) |
| H05K 9/00 | (2006.01) |

(52) U.S. Cl.
CPC ......... *H02M 7/003* (2013.01); *H02M 7/5387* (2013.01); *H05K 9/0015* (2013.01); *H05K 7/209* (2013.01)

(58) Field of Classification Search
CPC ...... H02M 7/003; H05K 9/0015; H05K 7/209
See application file for complete search history.

(56) References Cited

U.S. PATENT DOCUMENTS

| 5,579,217 A | * | 11/1996 | Deam | ............... H01L 23/52 257/E23.141 |
| 6,064,578 A | * | 5/2000 | Hashimoto | ............ H02M 7/003 363/16 |
| 2002/0195286 A1 | * | 12/2002 | Shirakawa | ......... H05K 7/14329 257/E23.079 |
| 2003/0072117 A1 | * | 4/2003 | Maekawa | ............... H05K 9/002 361/86 |
| 2008/0063232 A1 | | 3/2008 | Song | |

(Continued)

FOREIGN PATENT DOCUMENTS

| JP | S54-033006 U | 3/1979 |
| JP | 2002-141690 A | 5/2002 |

(Continued)

*Primary Examiner* — Gary L Laxton
(74) *Attorney, Agent, or Firm* — Oliff PLC

(57) ABSTRACT

A power converter includes a semiconductor modules, a capacitor, a housing, a shield layer and a collar member. The capacitor is electrically connected to the semiconductor modules. The housing houses at least the semiconductor modules and the capacitor. The shield layer is electrically conductive and provided on and covers at least one of inner and outer surfaces of the housing. The collar member is electrically conductive and integrated with the housing. The collar member is configured to allow a fastener to be inserted through the collar member such that the housing is fixed to a vehicle-side member via the fastener. The collar member is electrically conductively joined to the shield layer.

11 Claims, 4 Drawing Sheets

(56) References Cited

U.S. PATENT DOCUMENTS

2014/0233281 A1* 8/2014 Goto .................. H02M 7/003
                                                        363/39
2014/0240946 A1* 8/2014 Fukumasu ............ B60L 58/20
                                                        361/811
2017/0223859 A1   8/2017 Matsuo

FOREIGN PATENT DOCUMENTS

| | | |
|---|---|---|
| JP | 2008-041718 A | 2/2008 |
| JP | 2014-082274 A | 5/2014 |
| JP | 2016-058704 A | 4/2016 |
| JP | 2019-193335 A | 10/2019 |
| WO | 2021/157206 A1 | 8/2021 |

* cited by examiner

POWER CONVERTER

CROSS REFERENCE TO RELATED APPLICATIONS

The present application is a continuation application of International Patent Application No. PCT/JP2020/046764 filed on Dec. 15, 2020, which designated the U.S. and claims the benefit of priority from Japanese Patent Application No. 2020-016455 filed on Feb. 3, 2020. The entire disclosures of all of the above applications are incorporated herein by reference.

TECHNICAL FIELD

The present disclosure relates to a power converter.

BACKGROUND

A power converter includes a case body made of resin and plated.

SUMMARY

According to at least one embodiment of the present disclosure, a power converter includes a semiconductor modules, a capacitor, a housing, a shield layer and a collar member. The capacitor is electrically connected to the semiconductor modules. The housing houses at least the semiconductor modules and the capacitor. The shield layer is electrically conductive and provided on and covers at least one of inner and outer surfaces of the housing. The collar member is electrically conductive and integrated with the housing. The collar member is configured to allow a fastener to be inserted through the collar member such that the housing is fixed to a vehicle-side member via the fastener. The collar member is electrically conductively joined to the shield layer.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

Figure 1:
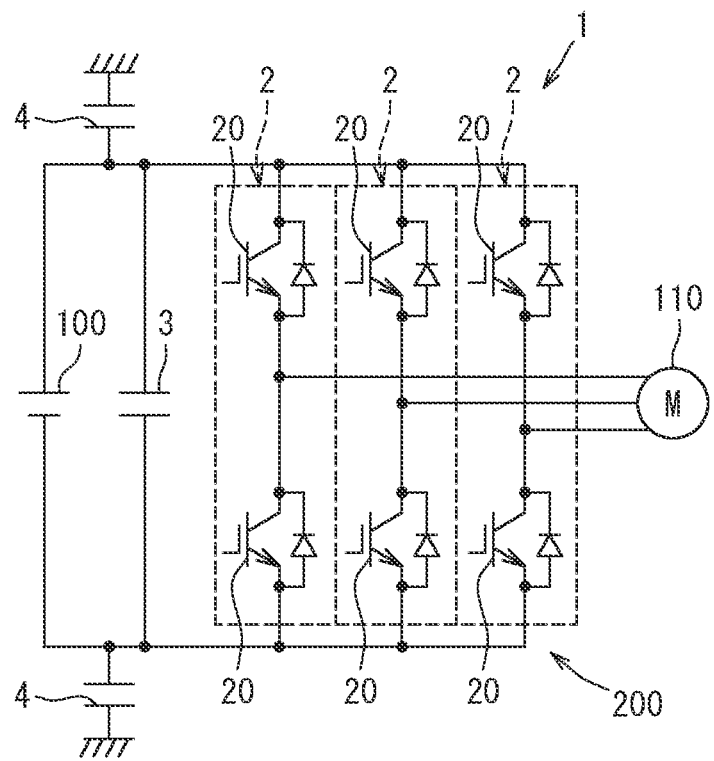
FIG. 1 is a circuit diagram according to a power converter of a first embodiment.

To begin with, examples of relevant techniques will be described. A power converter according to a comparative example includes a case that includes a case body made of resin and plated.

The power converter of the comparative example further includes constituent elements, such as an adhesive, a PCB substrate, a connection pattern, and a connection terminal, in order to ground the case.

According to an aspect of the present disclosure, a power converter includes a semiconductor modules, a capacitor, a housing, a shield layer and a collar member. The capacitor is electrically connected to the semiconductor modules. The housing houses at least the semiconductor modules and the capacitor. The shield layer is electrically conductive and provided on and covers at least one of inner and outer surfaces of the housing. The collar member is electrically conductive and integrated with the housing. The collar member is configured to allow a fastener to be inserted through the collar member such that the housing is fixed to a vehicle-side member via the fastener. The collar member is electrically conductively joined to the shield layer.

According to this power converter, the shield layer can be grounded to the vehicle-side member through the collar member by fixing the housing to the vehicle-side member using the fastener inserted through the collar member. As a result, an electromagnetic noise transmitted to the shield layers can be moved to the vehicle-side member via the collar member. Therefore, according to the power converter, a noise suppression effect can be exerted just by fixing the housing to the vehicle-side member.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A first embodiment that discloses one example of a power converter will be described with reference to FIG. 1 and FIG. 2. The power converter can be applied to an in-vehicle power converter to be mounted on a vehicle such as an electric car or a hybrid vehicle. The power converter capable of achieving the object specified in the specification can be applied to, for example, an inverter device, a converter device, or the like. In this embodiment, the power converter to be applied to an inverter device will be described below.

A power converter 1 includes an inverter circuit 200. As illustrated in FIG. 1, the inverter circuit 200 includes a plurality of semiconductor modules 2. By turning on and off semiconductor elements 20 (IGBT elements) included in the semiconductor modules 2, DC power supplied from a DC power supply 100 is converted into AC power. A vehicle travels by driving a three-phase AC motor 110 using the obtained AC power. A smoothing capacitor 3 is connected in parallel to the semiconductor modules 2. One of Y-capacitors 4 is connected to a positive electrode wiring and is connected to the ground. The other of the Y-capacitors 4 is connected to a negative electrode wiring and is connected to the ground. In the vehicle, the Y-capacitors 4 are electrically connected to a body ground, such as a chassis, via a case ground of the power converter 1.

Figure 2:
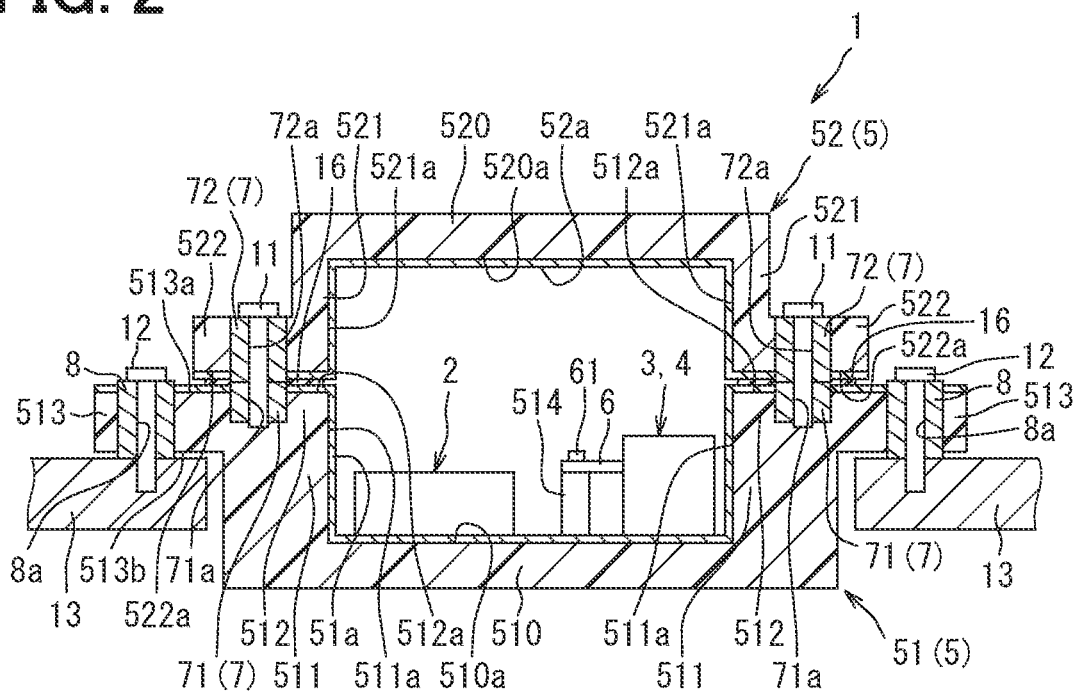
FIG. 2 is a cross-sectional view illustrating a schematic configuration of the power converter of the first embodiment.

As illustrated in FIG. 2, the power converter 1 includes a housing 5 that houses electric components. The housing 5 houses the plurality of semiconductor modules 2, the smoothing capacitor 3, the Y-capacitors 4, a control circuit board, and the like. The smoothing capacitor 3 is connected in parallel to the semiconductor modules 2 so as to be capable of receiving power. The smoothing capacitor 3 and the Y-capacitors 4 are fixed to the housing 5. The smoothing capacitor 3 and the Y-capacitors 4 are fixed to a support base 514 by a fastener 11, such as a bolt, a screw, or a rivet, or joint measures such as welding joint or brazing joint. Hereinafter, the smoothing capacitor 3 and the Y-capacitors 4 may be collectively referred to as capacitors. The support base 514 is provided integrally with the housing 5 or attached to the housing 5. The support base 514 is formed of a material similar to or different from the material of the housing 5. The support base 514 is joined to the capacitors via joining members such as terminals or bus bars. With this configuration, the capacitors are joined to the support base 514 in a state of receiving power.

The housing 5 forms a container. The housing 5 is formed by combining a plurality of case members. The housing 5 includes at least a first case member and a second case member. The first case member and the second case member are resin molded articles formed by containing a resin material. The first case member is, for example, a lower case 51 surrounding the periphery of the control circuit board, the semiconductor modules 2, the capacitors, and the like. The control circuit board, the semiconductor modules 2, the capacitors, and the like are housed in an internal space of the housing 5, for example, in an internal space of the lower case 51. The second case member is, for example, a cover member 52 attached to the lower case so as to cover the internal space of the lower case 51. The cover member 52 is integrally fixed to the lower case 51 so as to cover the lower case from above.

The lower case 51 integrally includes a bottom wall portion 510, a side wall portion 511 erected from a peripheral edge of the bottom wall portion 510, a joint portion 512, and a fixed portion 513. The bottom wall portion 510 corresponds to a bottom portion of the housing 5, and the semiconductor modules 2, the support base 514, the capacitors, and the like are installed. The side wall portion 511 is a peripheral wall that surrounds the periphery of the semiconductor modules 2 and the capacitors and extends vertically upward with respect to the bottom wall portion 510. The side wall portion 511 and the bottom wall portion 510 define and form the internal space of the lower case 51.

The cover member 52 integrally includes a top wall portion 520, a side wall portion 521 erected from a peripheral edge of the top wall portion 520, and a joint portion 522. The top wall portion 520 corresponds to a ceiling portion of the housing 5, and covers, from above, the semiconductor modules 2, the support base 514, the capacitors, and the like. The side wall portion 521 is a peripheral wall extending vertically downward with respect to the top wall portion 520. The side wall portion 521 and the top wall portion 520 form an upper portion in the internal space of the lower case 51.

In the power converter 1, shield layers each having conductivity are provided in the housing 5. The shield layers are provided at positions covering an inner surface or an outer surface of the housing, or at positions covering the inner surface and the outer surface. The shield layers disclosed in the first embodiment include an inner shield layer 51a and an inner shield layer 52a each covering the inner surface of the housing 5.

The inner shield layer 51a is provided at a position covering the inner surface of the lower case 51. The inner surface, provided with the inner shield layer 51a, of the lower case 51 is an inner surface 510a of the bottom wall portion 510, an inner surface 511a of the side wall portion 511, and the like. Furthermore, the inner shield layer 51a is provided on a joint surface 512a of the joint portion 512 and on a surface 513a of the fixed portion 513 on the extension of the joint surface 512a. The inner shield layer 51a exerts an effect of suppressing leakage of electromagnetic noise to the outside of the housing 5 on the inner surface side of the lower case 51. The inner shield layer 52a is provided at a position covering the inner surface of the cover member 52. The inner surface, provided with the inner shield layer 52a, of the cover member 52 is an inner surface 520a of the top wall portion 520, an inner surface 521a of the side wall portion 521, and the like. Furthermore, the inner shield layer 52a is provided on a joint surface 522a of the joint portion 522. The inner shield layer 52a exerts an effect of suppressing leakage of electromagnetic noise to the outside of the housing 5 on the inner surface side of the cover member 52.

The inner shield layers 51a and 52a can be formed of, for example, a metal layer or an alloy layer plated on the surface of the housing 5. The inner shield layers 51a and 52a may be, for example, copper plating plated on the surface of the housing 5. With this configuration, conductivity is high, the thickness dimensions of the shield layers can be suppressed, and weight and thickness can be reduced. The inner shield layers 51a and 52a can also be formed as a layer incorporated inside the housing 5 so as to cover the inner surface. In this case, the inner shield layers 51a and 52a are installed integrally with a resin portion of the housing 5 by performing insert molding when the housing 5 is die-molded.

The inner shield layer 51a and the inner shield layer 52a are preferably provided to overlap, in the housing 5, the entire inner side surface forming the internal space. With this, the electromagnetic noise, radiated from the internal space to the inner surface of the housing 5, can be shielded over a wide range with high probability.

The joint portion 522 forms a flange portion protruding outward from the side wall portion 521. The joint portion 512 is a portion joined to the joint portion 522 of the cover member 52. The joint portion 512 and the joint portion 522 respectively have the joint surface 512a and the joint surface 522a each being a plane orthogonal to a joint direction in which the lower case 51 and the cover member 52 are combined. The joint portion 512 and the joint portion 522 are joined by a fastener 11, such as a bolt or a screw, and the collar member 7 in a state where the joint surface 512a and the joint surface 522a face each other. The collar member 7 includes a first collar 71 and a second collar 72, and is provided integrally with the housing 5. The collar member 7 is a reinforcing member that supports the fastener and reinforces the joint portion.

The second collar 72 is a cylindrical body provided with a through hole 72a penetrating in an axial direction. The through hole 72a of the second collar 72 is formed to have an inner diameter dimension through which a shaft portion of the fastener 11 can be inserted. The first collar 71 is a cylindrical body provided with a through hole 71a penetrating in an axial direction. A female screw is formed on an inner peripheral surface of the first collar 71 forming the through hole 71a. The female screw is formed such that a male screw formed in the shaft portion of the fastener 11 can be screwed.

The first collar 71 is provided integrally with the joint portion 512 in a state where one end portion in the axial direction slightly protrudes from the joint surface 512a. The other end portion, in the axial direction, of the first collar 71 is embedded in the joint portion 512. The one end portion, in the axial direction, of the first collar 71 is in contact with the inner shield layer 52a. With this configuration, the first collar 71 and the inner shield layer 52a are in an electrically conductive relationship. The first collar 71 is provided by being inserted into a die forming the lower case 51 and molded integrally with the resin when a surrounding resin portion is solidified.

The second collar 72 is provided integrally with the joint portion 522 so as to penetrate the joint portion 522 in the axial direction. The second collar 72 is provided integrally with the joint portion 512 in a state where one end portion in the axial direction slightly protrudes from the joint surface 522a. The other end portion, in the axial direction, of the second collar 72 is exposed to the outside of the housing 5, and the head portion of the fastener 11 is in contact therewith. The head portion of the fastener 11 is a portion having an outer diameter larger than that of a shaft portion provided integrally with the other end portion, in the axial direction, of the shaft portion. The one end portion, in the axial direction, of the second collar 72 is in contact with the inner shield layer 51a. With this configuration, the second collar 72 and the inner shield layer 51a are in an electrically conductive relationship. The second collar 72 is provided by being inserted into a die forming the cover member 52 and molded integrally with the resin when a surrounding resin portion is solidified.

The joint portion 512 and the joint portion 522 are joined by screwing the male screw of the fastener 11 inserted through the second collar 72 with the female screw of the first collar 71. In a state where the joint portion 512 and the joint portion 522 are joined by the fastener 11 and the collar member 7, the one end portion, in the axial direction, of the first collar 71 is in contact with the one end portion, in the axial direction, of the second collar 72. With this contact state, the first collar 71 is electrically conductively connected to the second collar 72. The inner shield layer 51a and the inner shield layer 52a are in an electrically conductive relationship via the collar member 7.

A seal portion 16 may be provided between the joint portion 512 and the joint portion 522. The seal portion 16 is a seal packing having conductivity and elasticity, and is interposed between the cover member 52 and the lower case 51 to seal therebetween. The seal portion 16 can be formed of a sheet-like member, grease, or a gel-like object each having conductivity.

The seal portion 16 is in contact with the inner shield layer 52a provided on the cover member 52 and the inner shield layer 51a provided on the lower case 51. With this, electromagnetic noise and the like can be shielded by the seal portion 16, the inner shield layer 51a, and the inner shield layer 52a at the joint portion of the housing 5, so that the effect of suppressing leakage of noise can be improved. Alternatively, the seal portion 16 may be formed of a non-conductive seal packing.

The fixed portion 513 is a plate-like portion extending outward from the joint portion 512, and is a portion fixed to an installation base 13. The installation base 13 is one of a chassis of the vehicle, a body of the vehicle, and a vehicle-side member that is a member mounted on the vehicle. The installation base 13 is one of vehicle-side members that are functional components, such as a motor device, mounted on the vehicle. The fixed portion 513 may be provided at the same position, in a circumferential direction of the housing 5, as the joint portion 512, or may be provided at a position shifted in the circumferential direction with respect to the joint portion 512. The fixed portion 513 has the surface 513a located on the same side as the joint surface 512a and an installation surface 513b forming a plane facing the installation base 13. The fixed portion 513 and the installation base 13 are joined by a fastener 12, such as a bolt or a screw, and the collar member 8 in a state where the installation surface 513b faces the surface of the installation base 13. The collar member 8 is provided integrally with the fixed portion 513. The collar member 8 is a reinforcing member that supports the fastener 12 and reinforces the fixed portion 513.

The collar member 8 is a cylindrical body provided with a through hole 8a penetrating in an axial direction. The through hole 8a of the collar member 8 is formed to have an inner diameter dimension through which a shaft portion of the fastener 12 can be inserted. The installation base 13 is provided with, for example, a female screw formed such that a male screw formed in the shaft portion of the fastener 12 can be screwed. Alternatively, the installation base 13 may be provided with a through hole through which the shaft portion of the fastener 12 can be inserted. In this case, the fixed portion 513 and the installation base 13 are integrally fixed by the fastener 12 including a bolt and a nut and the collar member 8.

The collar member 8 is provided integrally with the fixed portion 513 so as to penetrate the fixed portion 513 in the axial direction. The collar member 8 is provided integrally with the fixed portion 513 in a state where one end portion, in the axial direction, of the collar member slightly protrudes from the surface 513a of the fixed portion 513 and the other end portion in the axial direction is in contact with the installation base 13. The one end portion, in the axial direction, of the collar member 8 is in contact with the inner shield layer 51a. With this configuration, the collar member 8 and the inner shield layer 51a are in an electrically conductive relationship. Furthermore, the inner shield layer 51a conducts with the installation base 13 via the inner shield layer 51a. The collar member 8 is provided by being inserted into the die forming the lower case 51 and molded integrally with the resin when the surrounding resin portion is solidified.

The internal space of the housing 5 is partitioned into a capacitor housing space and a semiconductor module housing space by, for example, a partition wall. In addition to the semiconductor modules 2, a control circuit board and the like are installed in the semiconductor module housing space.

The smoothing capacitor 3 and the Y-capacitors 4 are electrically connected to the semiconductor modules 2. The smoothing capacitor 3 smooths a DC voltage to be applied to the semiconductor modules 2. The smoothing capacitor 3 includes a capacitor element, a sealing member, a terminal, and the like. The smoothing capacitor 3 includes a capacitor element housed in a capacitor housing portion, and a sealing member filling the capacitor housing space to seal the capacitor element. The sealing member seals, in the capacitor housing space, the capacitor element of the smoothing capacitor 3 and the capacitor elements of the Y-capacitors 4. The sealing member corresponds to an exterior portion of the smoothing capacitor and the Y-capacitors 4. The capacitor elements are connected to electrode plates and the like. For example, film capacitors can be used as the capacitor elements.

The sealing member is made of a thermosetting resin such as an epoxy resin. The sealing member fills gaps between the capacitor elements and the capacitor housing portion and between the terminals and the capacitor housing portion. With this configuration, the sealing member seals the capacitor elements, the terminals, and the like. A part of the terminal or the like protrudes from the sealing member.

When the capacitors are manufactured, the capacitor elements are housed in the capacitor housing space, and an uncured sealing member is further injected. Then, heat is applied to cure the sealing member, whereby the capacitors are manufactured. The capacitor may include an exterior case that houses the capacitor element. The capacitor may have a configuration in which a film covering the element is used as an exterior portion.

The semiconductor module 2 includes a main body incorporating the semiconductor element 20, and a power terminal and a control terminal each protruding from the main body. The semiconductor module 2 is also referred to as a power module. The power terminal includes an input terminal to which a DC voltage is applied and an output terminal connected to an output-side bus bar on the three-phase AC motor 110 side. The input terminal is connected to the terminal of the capacitor, and is electrically connected to an output portion of the DC power supply 100 via an input-side bus bar. The control terminal is connected to the control circuit board. The control circuit board constitutes a circuit board on which an electronic component, such as an arithmetic element, that controls the operation of the semiconductor element 20 is mounted. The on-off operation of the semiconductor element 20 is controlled by the control circuit board. With this control, the DC power supplied from the DC power supply 100 is converted into AC power.

The control circuit board is fixed, for example, in a state of being supported by a boss provided in the lower case 51. The control circuit board is electrically connected, via wiring, to a connector protruding to the outside of the housing 5. This connector can be connected to a peripheral device installed outside the power converter 1.

The power converter 1 has a configuration in which electromagnetic noise that may cause a disturbance to electric components and the like are generated, propagated, and radiated. Hereinafter, the electromagnetic noise may be referred to as noise. In the power converter 1, noise is propagated by allowing a high-frequency current or the like to flow through a power path. For example, a switching power supply becomes a source of noise. The switching power supply includes an electric circuit that converts a voltage or a frequency by interrupting a current with a semiconductor. Since high-frequency energy is generated at a portion where a current is interrupted in such a way, a noise disturbance is caused when this energy leaks to the outside due to propagation and radiation. The high-frequency energy is absorbed by a capacitor or the like, but it may leak to the outside. In addition, electromagnetic noise can also be generated due to a kind of switching surge phenomenon in which a current is interrupted by a commutator or the like. In addition, there is a possibility that in the power converter 1, the capacitor becomes a source of noise.

The electromagnetic noise is transmitted to the housing 5 by radiation or propagation, and can be emitted from the housing 5 to the outside. In order to suppress a noise disturbance, it is desirable to promptly emit the electromagnetic noise transmitted to the housing 5 to the ground or the like. The power converter 1 includes the shield layers and the collar member, and thus has a configuration in which the electromagnetic noise can be promptly emitted to ground or the like.

The power converter 1 includes a bus bar including the input-side bus bar and the output-side bus bar. The power converter 1 includes a bus bar for inputting and outputting power. The bus bar is an electrically conductive member that forms, in the power converter 1, a power path contacting a terminal portion on the input side and a terminal portion on the output side. The bus bar is an electrically conductive member connected to an input side or an output side of at least one of the semiconductor modules 2 and the capacitors. Such a bus bar serves as one of the power paths and can propagate electromagnetic noise. The inner shield layers 51a and 52a can suppress emission of noise radiated from the bus bar to the outside after passing through the housing 5.

Actions and effects exerted by the power converter 1 of the first embodiment will be described. The power converter 1 includes the housing 5 that houses at least the plurality of semiconductor modules 2 and capacitors connected to the semiconductor modules 2 so as to be capable of receiving power. The power converter 1 includes shield layers each having conductivity that are respectively provided to cover at least one of the inner surface and the outer surface of the housing. The power converter 1 includes the collar member 8 that is provided integrally with the housing 5 in order to fix the housing 5 to a vehicle-side member using the fastener 12, that has conductivity, and through which the fastener 12 can be inserted. In the power converter 1, the collar member 8 is electrically conductively joined to the shield layers.

In the power converter 1, radio noise is generated from various sources of noise. Since radio noise radiated into the housing 5 can cause a problem, it is required to promptly emit it. With the power converter 1, the shield layers contribute to preventing radiation or diffusion of electromagnetic noise. With the power converter 1, the shield layer is grounded to the vehicle-side member through the collar member 8 by fixing the housing 5 to the vehicle-side member using the fastener 12 inserted through the collar member 8. As a result, it is possible to provide the power converter 1 that can promptly move the electromagnetic noise transmitted to the shield layers to the vehicle-side member via the collar member 8. The power converter 1 can suppress spatial conduction of electromagnetic noise or the like to the inside or outside of the housing via the housing 5. As described above, the power converter 1 exerts a noise suppression effect by fixing the housing 5 to the vehicle-side member with a simple configuration. The power converter 1 can suppress a noise disturbance to the electric components in the housing and peripheral devices around the housing 5.

The collar member 8 is provided in a state of penetrating the fixed portion 513 of the housing 5 that is fixed to the vehicle-side member. The collar member 8 is in contact with the shield layers at one end in a penetrating direction. With this configuration, the collar member 8 connects the fixed portion 513 and the vehicle-side member so as to electrically bridge them, by fixing the fixed portion 513 to the vehicle-side member using the fastener 12.

Furthermore, the collar member 8 preferably has a conductivity per unit volume higher than those of the shield layers. With this configuration, it is possible to provide the power converter 1 that promptly moves the electromagnetic noise cut off in the shield layers to the collar member 8 and further propagates the electromagnetic noise to the vehicle-side member.

The housing 5 includes the first case member provided with the shield layer and the second case member attached to the first case member so as to cover the internal space of the first case member. The first case member is provided with the support base 514 that electrically conductively supports the Y-capacitor 4 included in the capacitors, and the collar member 8. With this configuration, it is possible to provide, as a noise emission path, a path extending over the Y-capacitor 4, the support base 514, the first case member, the shield layers, the collar member 8, and the vehicle-side member. As a result, emission of the noise related to the Y-capacitor 4 can be promoted, and EMC performance can be improved.

The housing 5 includes the first case member provided with a shield layer and the second case member that is provided with a shield layer and attached to the first case member. The first case member includes the joint portion 512 joined to the second case member. The second case member includes the joint portion 522 joined to the joint portion 512. The power converter 1 includes the first collar 71 provided integrally with the joint portion 512 in order to fix the joint portion 512 and the joint portion 522 using the fastener 11. The power converter 1 includes the second collar 72 provided integrally with the joint portion 522 in order to fix the joint portion 512 and the joint portion 522 using the fastener 11. Each of the first collar 71 and the second collar 72 is a cylindrical body that has conductivity and through which the fastener 11 can be inserted. The first collar 71 is in contact with the second collar 72 in a state where the joint portion 512 and the joint portion 522 are joined by the fastener 11. The first collar 71 is electrically conductively joined to the shield layer of the first case member. The second collar 72 is electrically conductively joined to the shield layer of the second case member.

With this configuration, the noise propagated to the shield layer of the first case member and the shield layer of the second case member can be emitted to the vehicle-side member via the collar member 8. As a result, emission of the noise propagated throughout the housing 5 can be promoted, and EMC performance can be improved.

The power converter 1 includes, as the shield layer, the inner shield layer 51a provided on the first case member so as to cover the inner surface of the first case member. The power converter 1 includes, as the shield layer, the inner shield layer 52a provided on the second case member so as to cover the inner surface of the second case member. With this configuration, radiation of electromagnetic noise or the like from the inside to the outside of the housing 5 through the housing 5 can be suppressed by the inner shield layers 51a and 52a. The power converter 1 provides the noise emission path that propagates electromagnetic noise through the inner surface of the housing 5 and promptly emits the electromagnetic noise to the vehicle-side member via the collar member.

The housing includes the first case member provided with the shield layer and the second case member attached to the first case member so as to cover the internal space of the first case member. The shield layer includes the inner shield layer 51a of the first case member that is provided on the first case member so as to cover the inner surface, and the inner shield layer 52a of the second case member that is provided on the second case member so as to cover the inner surface. The seal portion 16, which is an electrically conductive seal portion and is interposed between the first case member and the second case member to seal therebetween, is in contact with the inner shield layer 51a and the inner shield layer 52a. With this configuration, a sealing property between the first case member and the second case member can be secured by the seal portion 16. Furthermore, the seal portion 16 is in close contact with the inner shield layer 51a and the inner shield layer 52a. Therefore, the electromagnetic noise and the like staying in the housing 5 can be shielded by the seal portion 16, the inner shield layer 51a, and the inner shield layer 52a. As a result, it is possible to provide the power converter 1 that can suppress spatial conduction of electromagnetic noise or the like to the internal space of the housing 5.

Second Embodiment

A second embodiment will be described with reference to FIG. 3. A power converter of the second embodiment is different from the power converter of the first embodiment in a configuration of a collar member 108. Configurations, actions, and effects not particularly described in the second embodiment are similar to those of the first embodiment, and differences from the first embodiment will be described below.

Figure 3:
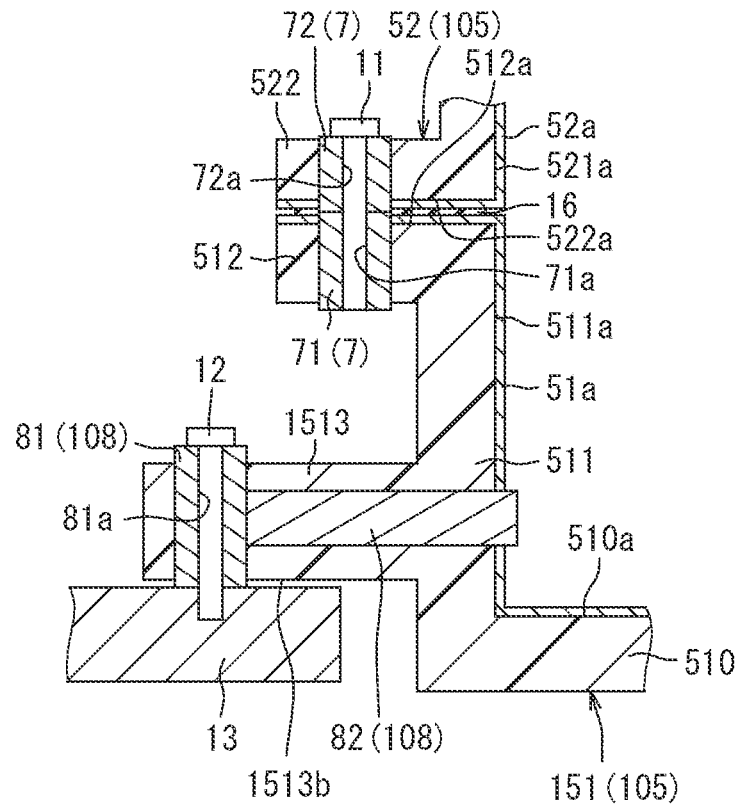
FIG. 3 is a partial cross-sectional view illustrating a power converter of a second embodiment.

As illustrated in FIG. 3, the power converter includes the collar member 108 for joining a fixed portion 1513 and the installation base 13. The collar member 108 is provided integrally with a fixed portion 1513. The fixed portion 1513 is a portion that extends outward from the side wall portion 511 and is fixed to the installation base 13. The collar member 108 includes a tubular portion 81 and a conductor 82 joined to the tubular portion 81. The collar member 108 is a reinforcing member that supports the fastener 12 and reinforces the fixed portion 1513.

The conductor 82 is, for example, a rod-like body or a cylindrical body. The conductor 82 has a shape extending in a direction perpendicular to an axial direction of the tubular portion 81. One end portion, in the axial direction, of the conductor 82 is a joint portion joined to the tubular portion 81. The other end portion, in the axial direction, of the conductor 82 is an inner-shield-layer contact portion that protrudes inward from the inner surface 511a of the side wall portion 511, which is a part of the housing 105, and that is in contact with the inner shield layer 51a.

The tubular portion 81 includes a through hole 81a penetrating in the axial direction. The through hole 81a of the tubular portion 81 is formed to have an inner diameter dimension through which the shaft portion of the fastener 12 can be inserted. The tubular portion 81 is provided integrally with the fixed portion 1513 so as to penetrate the fixed portion 1513 in the axial direction. The tubular portion 81 is provided such that one end portion in the axial direction slightly protrudes from the surface of the fixed portion 1513 and the other end portion in the axial direction is in contact with the installation base 13.

With the above configuration, the collar member 108 and the inner shield layer 51a are in an electrically conductive relationship. Furthermore, the inner shield layer 51a conducts with the installation base 13 via the inner shield layer 51a. The collar member 108 is provided by being inserted into a die forming a lower case 151 and molded integrally with the resin when a surrounding resin portion is solidified.

The collar member 108 of the second embodiment includes the conductor 82 integrally including the tubular portion 81 penetrating the fixed portion 1513 and the inner-shield-layer contact portion that is joined to the tubular portion 81 and is in contact with the inner shield layer 51a. With this configuration, it is possible to provide the power converter that can promote emission of noise by allowing the inner shield layer 51a to conduct with the collar member 108 via the conductor 82, and EMC performance can be improved.

Third Embodiment

A third embodiment will be described with reference to FIG. 4. A power converter of the third embodiment is different from the power converter of the first embodiment in that a shield layer is electrically conductively connected to a cooling member 14. Configurations, actions, and effects not particularly described in the third embodiment are similar to those of the first embodiment, and differences from the first embodiment will be described below.

Figure 4:
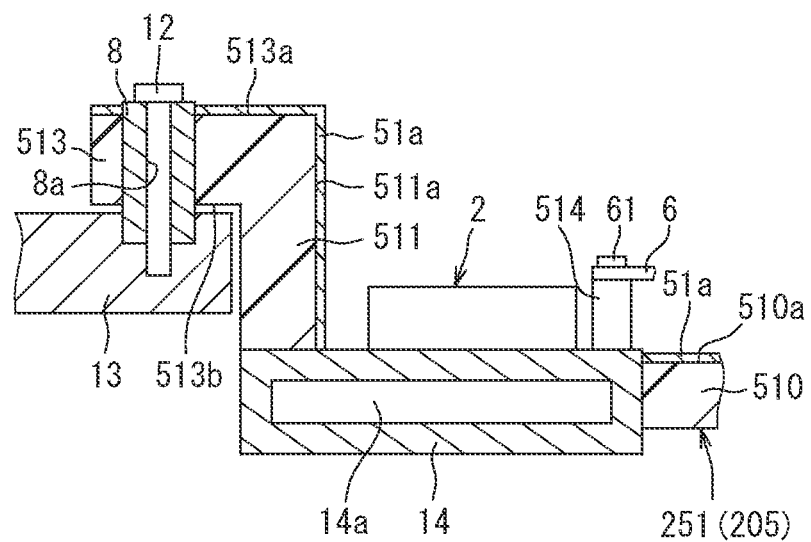
FIG. 4 is a partial cross-sectional view illustrating a power converter of a third embodiment.

As illustrated in FIG. 4, the power converter includes the cooling member 14 that cools the semiconductor modules 2. The cooling member 14 is provided in contact with the semiconductor modules 2 or in contact with the semiconductor modules 2 so as to be capable of transferring heat via a thermally conductive member. Alternatively, the cooling member 14 may be configured to be in contact with a housing 205 or in contact with the housing 205 so as to be capable of transferring heat via a thermally conductive member. The conductive member may be a sheet-like member, grease, or a gel-like object each being conductive or non-conductive. The cooling member 14 has a plate shape and includes a flow path 14a through which a cooling fluid circulates. The cooling member 14 is integrally fixed to the housing 205 by a fastener such as a bolt or a screw. The cooling member 14 is provided in the housing 205 as a part of a lower case 251. The cooling member 14 is in contact with the inner shield layer 51a to be able to conduct with the inner shield layer 51a.

The power converter of the third embodiment includes the cooling member 14 having conductivity capable of cooling the semiconductor modules 2, and the support base 514 that electrically conductively supports the Y-capacitor 4. The support base 514 is provided in contact with the cooling member 14 or provided to be capable of conducting with the cooling member 14 via the shield layer. With this, it is possible to provide the cooling member 14 having both a function of cooling the semiconductor modules 2 and a function of promoting emission of noise related to the Y-capacitor 4, whereby EMC performance can be improved.

Fourth Embodiment

A fourth embodiment will be described with reference to FIG. 5. A power converter of the fourth embodiment is different from the power converter of the first embodiment in a configuration of a collar member 208. Configurations, actions, and effects not particularly described in the fourth embodiment are similar to those of the first embodiment, and differences from the first embodiment will be described below.

Figure 5:
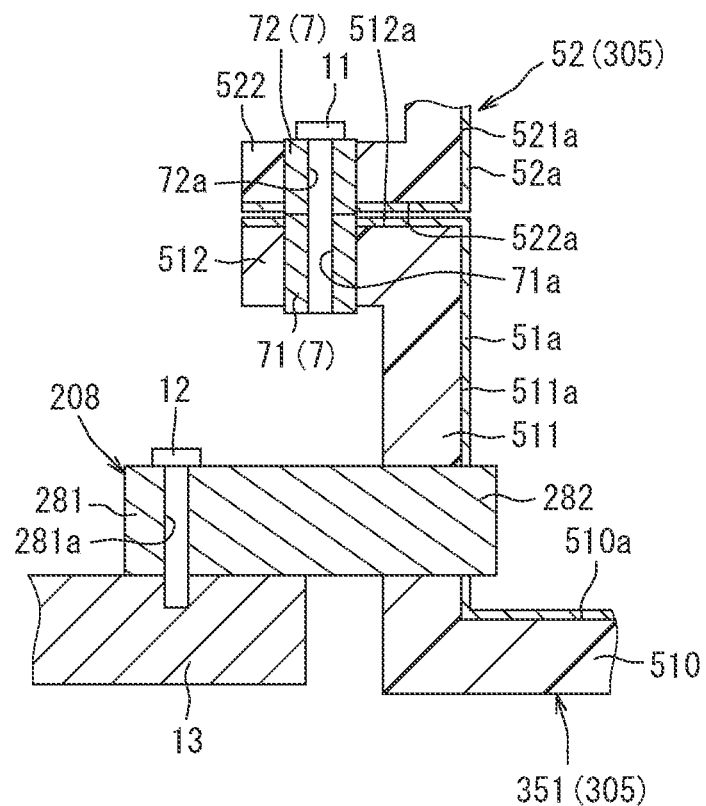
FIG. 5 is a partial cross-sectional view illustrating a power converter of a fourth embodiment.

As illustrated in FIG. 5, the power converter includes the collar member 208 that joins a housing 305 and the installation base 13 and has conductivity. The collar member 208 is in contact with the installation base 13 and is fixed to the installation base 13 by the fastener 12. The collar member 208 is a rod-like or plate-like member having a vehicle-side contact portion 281 in contact with the installation base 13 and an inner-shield-layer contact portion 282. A portion, on the inner-shield-layer contact portion 282 side, of the collar member 208 is provided integrally with the side wall portion 511. The portion extends outward from the side wall portion 511 toward the vehicle-side contact portion 281.

The collar member 208 is, for example, a rod-like body or a cylindrical body. The collar member 208 has a shape extending in a direction perpendicular to the side wall portion 511. An end portion, on one side, of the collar member 208 is the vehicle-side contact portion 281, while an end portion on the other side is the inner-shield-layer contact portion 282.

The vehicle-side contact portion 281 includes a through hole 281a penetrating in the axial direction. The through hole 281a is formed to have an inner diameter dimension through which the shaft portion of the fastener 12 can be inserted. In a state of being inserted through the through hole 281a, the fastener 12 is joined to the installation base 13 with the male screw of the shaft portion screwed with the female screw of the installation base 13. The vehicle-side contact portion 281 is fixed to the installation base 13 by being sandwiched between the head of the fastener 12 and the installation base 13.

With the above configuration, the installation base 13 and the inner shield layer 51a are in an electrically conductive relationship via the collar member 208. The collar member 208 is provided with the inner-shield-layer contact portion 282 inserted into a die forming a lower case 351 and by being molded integrally with the resin when a surrounding resin portion is solidified. The collar member 208 is a member that supports the fastener 12 and also functions as the fixed portion.

The collar member 208 of the fourth embodiment includes the vehicle-side contact portion 281 and the inner-shield-layer contact portion 282. The collar member 208 functions as the fixed portion 1513 of the third embodiment. With this configuration, it is possible to allow the inner shield layer 51a to contact with the vehicle-side member by providing the collar member 208 having conductivity integrally with the side wall portion 511.

Fifth Embodiment

A fifth embodiment will be described with reference to FIG. 6. A power converter of the fifth embodiment is different from the power converter of the first embodiment in a configuration of a shield layer and a support base 1514. Configurations, actions, and effects not particularly described in the fifth embodiment are similar to those of the first embodiment, and differences from the first embodiment will be described below.

Figure 6:
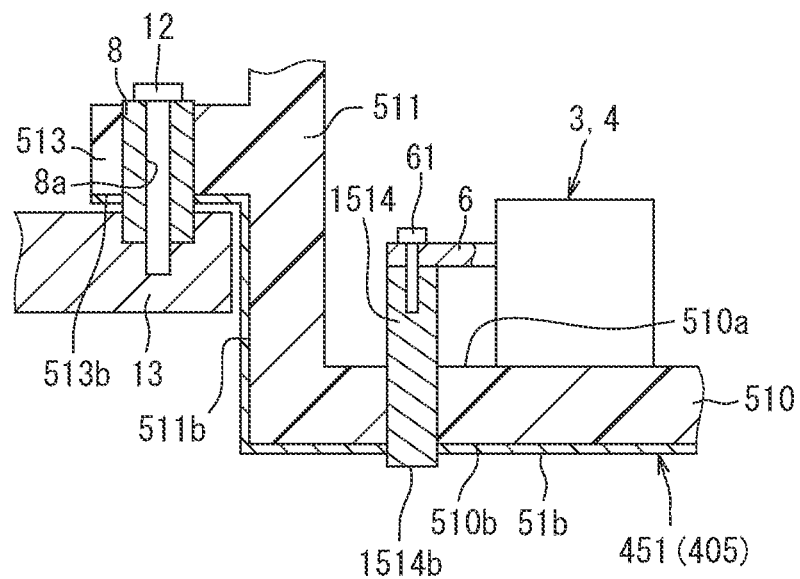
FIG. 6 is a partial cross-sectional view illustrating a power converter of a fifth embodiment.

As illustrated in FIG. 6, the power converter includes, as the shield layer, an outer shield layer 51b provided to cover an outer surface of a lower case 451. The outer shield layer 51b is provided on: an outer surface 510b of the bottom wall portion 510; an outer surface 511b of the side wall portion 511; the installation surface 513b of the fixed portion 513; and the like. The outer shield layer 51b is in contact with the collar member 8 and conducts with the installation base 13 via the collar member 8. The outer shield layer 51b may be configured to be in contact and conduct with the installation base 13 and the collar member 8 at a portion covering the installation surface 513b. The outer shield layer 51b exerts an effect of suppressing leakage of electromagnetic noise to the outside of a housing 405 on the outer surface side of the lower case 451.

The power converter of the fifth embodiment includes the support base 1514 that electrically conductively supports the Y-capacitor 4 inside the housing 405. The support base 1514 includes an outer-shield-layer contact portion 1514b that reaches the outer surface of the housing 405 to be in contact with the outer shield layer 51b. With this configuration, the outer shield layer 51b is grounded to the vehicle-side member by fixing the housing 405 to the vehicle-side member using the fastener 12 inserted through the collar member 8. As a result, it is possible to provide the power converter capable of moving electromagnetic noise related to the Y-capacitor 4 to the vehicle-side member through the support base 1514, the outer shield layer 51b, and the collar member 8.

Sixth Embodiment

A sixth embodiment will be described with reference to FIG. 7. A power converter 101 of the sixth embodiment is different from the power converter of the first embodiment in that an outer shield layer is provided. Configurations, actions, and effects not particularly described in the sixth embodiment are similar to those of the first embodiment, and differences from the first embodiment will be described below.

Figure 7:
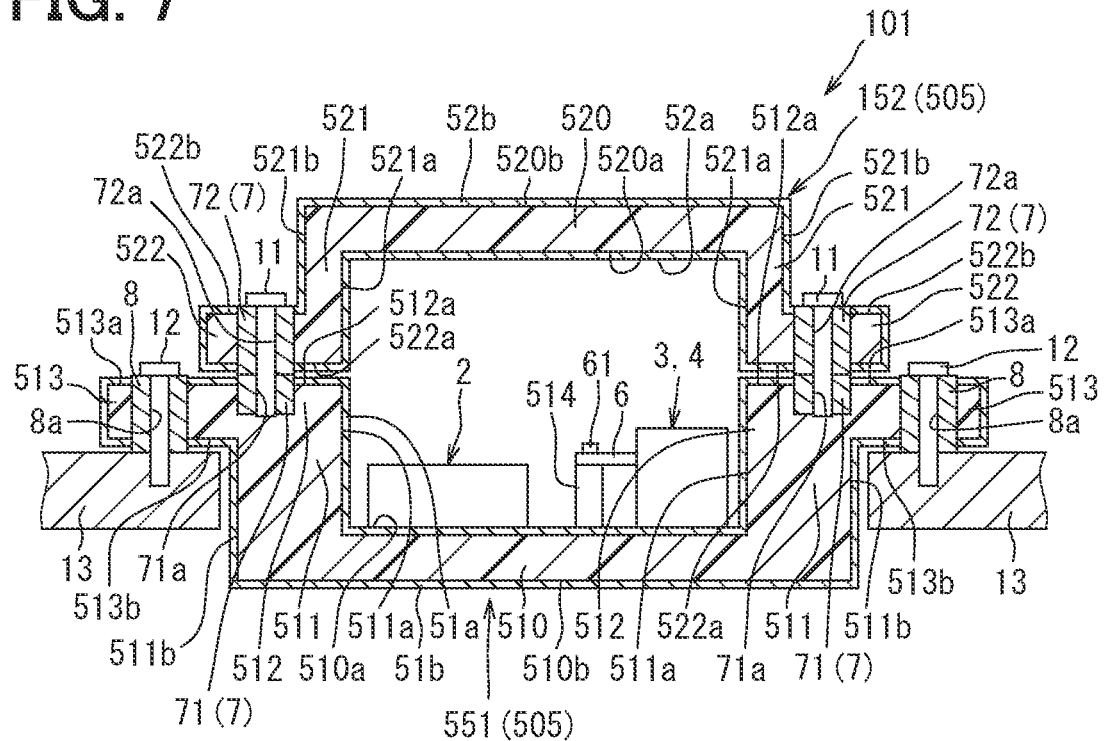
FIG. 7 is a cross-sectional view illustrating a schematic configuration of a power converter of a sixth embodiment.

As illustrated in FIG. 7, a shield layer of the power converter 101 is provided in a housing 505 so as to cover the inner surfaces and the outer surfaces of a lower case 551 and a cover member 152.

The outer shield layer 51b is provided at a position covering the outer surface of the lower case 551. The outer surface of the lower case 551 provided with the outer shield layer 51b is the outer surface 510b of the bottom wall portion 510, the outer surface 511b of the side wall portion 511, and the installation surface 513b of the fixed portion 513. The outer shield layer 51b exerts an effect of shielding electromagnetic noise on the outer surface side of the lower case 551 and suppressing leakage of noise to the outside of the housing 505. The outer shield layer 52b is provided at a position covering the outer surface of the cover member 152. The outer surface of the cover member 152 provided with the outer shield layer 52b is an outer surface 520b of the top wall portion 520, an outer surface 521b of the side wall portion 521, and a surface 522b of the joint portion 522. The outer shield layer 52b exerts an effect of shielding electromagnetic noise on the outer surface side of the cover member 152 and suppressing leakage of noise to the outside of the housing 505.

The power converter 101 includes the inner shield layers 51a and 52a and the outer shield layers 51b and 52b. With this configuration, electromagnetic noise can be shielded on both the inner surface side and the outer surface side of the housing 505, and the electromagnetic noise can be promptly emitted to the vehicle-side member via the collar member. Therefore, the power converter 101 can effectively suppress noise disturbances to the electric components in the housing and peripheral devices around the housing.

Seventh Embodiment

A seventh embodiment will be described with reference to FIG. 8. A power converter 201 of the seventh embodiment is different from the power converter of the sixth embodiment in that an inner shield layer is not provided and an outer shield layer is provided. Configurations, actions, and effects not particularly described in the seventh embodiment are similar to those of the above-described embodiments, and differences from the above-described embodiments will be described below.

Figure 8:
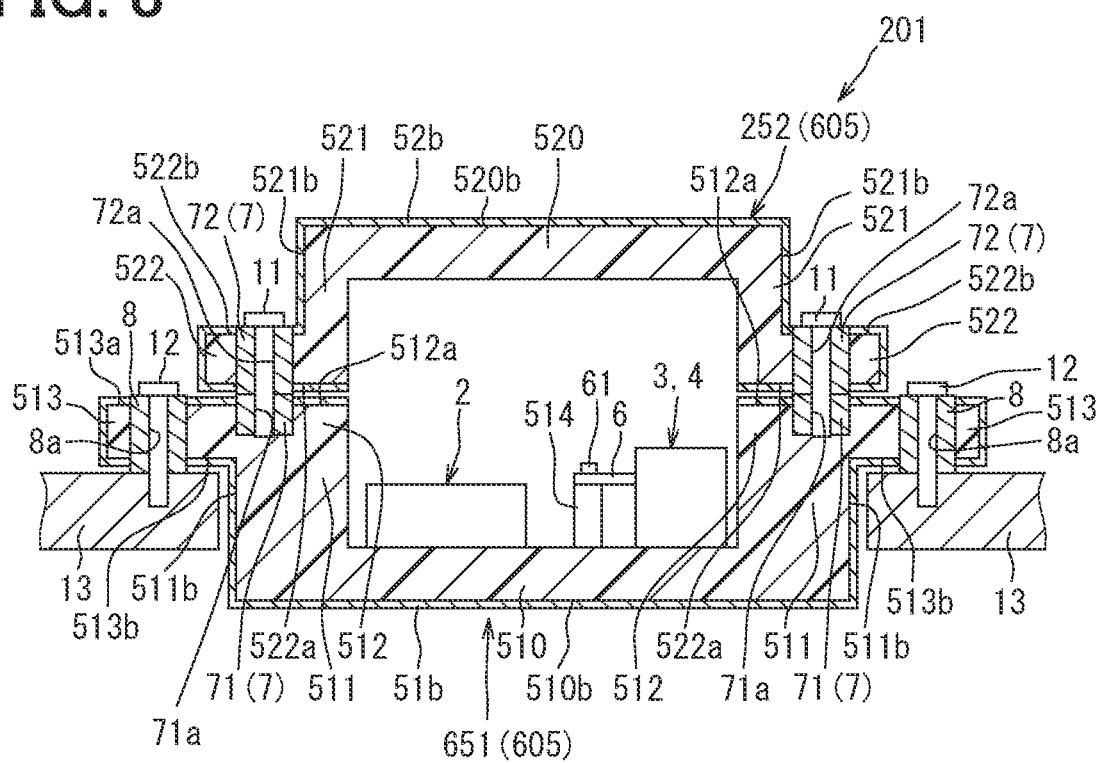
FIG. 8 is a cross-sectional view illustrating a schematic configuration of a power converter of a seventh embodiment.

As illustrated in FIG. 8, the power converter 201 includes, as the shield layers, the outer shield layer 51b covering the outer surface of a lower case 651 and the outer shield layer 52b covering the outer surface of a cover member 252. With this configuration, electromagnetic noise can be shielded on the outer surface side of a housing 605, and the electromagnetic noise can be promptly emitted to the vehicle-side member via the collar member.

Other Embodiments

The disclosure of this specification is not limited to the illustrated embodiments. The disclosure encompasses the illustrated embodiments and variations based thereon by those skilled in the art. The disclosure is not limited to the combinations of components and elements shown in the embodiments, and can be implemented, for example, by being variously modified. The disclosure can be implemented by various combinations. The disclosure can have additional portions that can be added to the embodiments. The disclosure encompasses those in which components and elements of the embodiments are omitted. The disclosure encompasses replacements or combinations of components and elements between one embodiment and another. The disclosed technical scope is not limited to the description of the embodiments. The disclosed technical scope is indicated by the description of the claims, and should be understood to include meanings equivalent to the description of the claims and all modifications within the scope.

The shield layer included in the power converter capable of achieving the object disclosed in the specification is not limited to the configuration provided on the inner surface side or the outer surface side of the housing. The shield layer may be configured to be incorporated in the housing. The shield layer incorporated in the housing 5 is provided to cover the inner surface side or the outer surface side of the housing.

In the above-described embodiments, the shield layer is provided to cover at least one of the inner surface and the outer surface of the housing. The shield layer includes a configuration to cover almost the entire of the inner surface and outer surface. The configuration of the shield layer is not limited to the configuration to cover the entire of the inner surface and outer surface as long as the shield layer is provided in a range in which external radiation of electromagnetic noise can be effectively suppressed.

The collar members and the shield layers disclosed in this specification are formed to include metal or a material having conductivity other than metal. The power converter includes a collar member and a shield layer each having a conductivity per unit volume larger than that of the housing.

The configuration, related to the shield layer, of the power converter capable of achieving the object disclosed in the specification is not limited to the forms illustrated in the drawings. The above-described collar members may be subjected to the same plating treatment as the shield layers. For example, when the shield layer is formed, an electrically conductive layer may be formed by performing a plating treatment including the collar member.

What is claimed is:

1. A power converter comprising:
one or more semiconductor modules;
a capacitor electrically connected to the semiconductor modules;
a housing that houses at least the semiconductor modules and the capacitor;
a shield layer electrically conductive and provided on and covering at least one of inner and outer surfaces of the housing; and
a collar member electrically conductive and integrated with the housing, the collar member being configured to allow a fastener to be inserted through the collar member such that the housing is fixed to a vehicle-side member via the fastener, wherein
the collar member is electrically conductively joined to the shield layer, the shield layer includes an inner shield layer that is provided on and covers an inner surface of the housing, and the collar member includes:
- a tubular portion extending through a fixed portion of the housing that is to be fixed to the vehicle-side member; and
- a conductor that integrally includes a joint portion joined to the tubular portion, and an inner-shield-layer contact portion that reaches the inner surface of the housing and is in contact with the inner shield layer.

2. The power converter according to claim 1, wherein the housing includes a first case member provided with the shield layer, and a second case member attached to the first case member so as to cover an internal space of the first case member, and the shield layer includes an inner shield layer that is provided on and covers an inner surface of the first case member, and an inner shield layer that is provided on and covers an inner surface of the second case member, the power converter comprising a seal portion electrically conductive and interposed between the first case member and the second case member to seal a gap therebetween, wherein the seal portion is in contact with the inner shield layer of the first case member and the inner shield layer of the second case member.

3. A power converter comprising:
one or more semiconductor modules;
a capacitor electrically connected to the semiconductor modules;
a housing that houses at least the semiconductor modules and the capacitor;
a shield layer electrically conductive and provided on and covering at least one of inner and outer surfaces of the housing; and
a collar member electrically conductive and integrated with the housing, the collar member being configured to allow a fastener to be inserted through the collar member such that the housing is fixed to a vehicle-side member via the fastener, wherein the collar member is electrically conductively joined to the shield layer, the housing includes a first case member provided with the shield layer, and a second case member attached to the first case member so as to cover an internal space of the first case member, and the shield layer includes a first inner shield layer that is provided on and covers an inner surface of the first case member, and a second inner shield layer that is provided on and covers an inner surface of the second case member, the power converter comprising a seal portion electrically conductive and interposed between the first case member and the second case member to seal a gap therebetween, wherein the seal portion is in contact with the first inner shield layer of the first case member and the second inner shield layer of the second case member.

4. The power converter according to claim 3, wherein the collar member extends in an extending direction through a fixed portion of the housing that is to be fixed to the vehicle-side member, and one end portion of the collar member in the extending direction is in contact with the shield layer.

5. The power converter according to claim 3, wherein the housing includes a first case member provided with the shield layer, and a second case member attached to the first case member so as to cover the internal space of the first case member, and the first case member includes the collar member and a support base that electrically conductively supports a Y-capacitor of the capacitor.

6. The power converter according to claim 3, wherein at least one of the first inner shield layer and the second inner shield layer is provided on and covers an inner surface of the housing.

7. The power converter according to claim 6, wherein the collar member includes:
- a vehicle-side contact portion that is to be in contact with and fixed to the vehicle-side member via the fastener; and
- an inner-shield-layer contact portion that reaches the inner surface of the housing and is in contact with the first inner shield layer.

8. The power converter according to claim 3, wherein the shield layer includes an outer shield layer that is provided on and covers an outer surface of the housing.

9. The power converter according to claim 3, wherein the shield layer includes the first inner shield layer and the second inner shield layer each of which is provided on and covers an inner surface of the housing, and an outer shield layer that is provided on and covers an outer surface of the housing.

10. The power converter according to claim 8, comprising a support base inside the housing, the support base electrically conductively supporting a Y-capacitor of the capacitor, wherein the support base includes an outer-shield-layer contact portion that reaches the outer surface of the housing and is in contact with the outer shield layer.

11. The power converter according to claim 3, comprising:
- a cooling member electrically conductive and in contact with the semiconductor modules such that the cooling member is capable of transferring heat and cooling the semiconductor modules; and
- a support base that electrically conductively supports a Y-capacitor of the capacitor, wherein the support base is provided in contact with the cooling member, or is electrically conductively connected to the cooling member via the shield layer.

* * * * *